United States Patent [19]
Yokoyama et al.

[11] Patent Number: 6,032,852
[45] Date of Patent: Mar. 7, 2000

[54] REWORKABLE MICROELECTRONIC MULTI-CHIP MODULE

[75] Inventors: Karen E. Yokoyama, Rancho Palos Verdes; Gershon Akerling, Culver City, both of Calif.

[73] Assignee: TRW Inc., Redondo Beach, Calif.

[21] Appl. No.: 09/156,447

[22] Filed: Sep. 19, 1998

Related U.S. Application Data

[62] Division of application No. 09/935,267, Sep. 22, 1997, Pat. No. 5,920,464.

[51] Int. Cl.[7] ..................................................... H01L 21/50
[52] U.S. Cl. ....................... 228/104; 228/115; 228/180.22
[58] Field of Search ..................... 228/103, 104, 228/115, 180.1, 180.22

[56] References Cited

U.S. PATENT DOCUMENTS

| | | | |
|---|---|---|---|
| 3,766,308 | 10/1973 | Loro | .......................................... 228/115 |
| 5,071,787 | 12/1991 | Mori et al. | . |
| 5,186,379 | 2/1993 | Helber, Jr. | ................................ 228/116 |

FOREIGN PATENT DOCUMENTS

| | | |
|---|---|---|
| 3276750 | 12/1991 | Japan . |
| 410446 | 1/1992 | Japan . |
| 864721 | 3/1996 | Japan . |

*Primary Examiner*—Samuel M. Heinrich
*Attorney, Agent, or Firm*—Michael S. Yatsko; Ronald M. Goldman

[57] ABSTRACT

A reworkable cold welded microelectronic multi-chip module contains cold welded microelectronic chips in which the chip's cold weld metal bonding pads (3) are constructed of a metal having one hardness and the corresponding cold weld metal bonding pads of the multi-chip module's substrate (5) are of a different greater hardness, which, despite the difference in hardness, cold weld to one another. Two forms of Indium preferably serve as the metals. If for any reason the chip must be removed from the module, it is found that the cold weld breaks at a predictable location. A new microelectronic chip may thereby be cold welded to the module substrate as a replacement. New rework and testing procedures are thereby made possible.

3 Claims, 2 Drawing Sheets

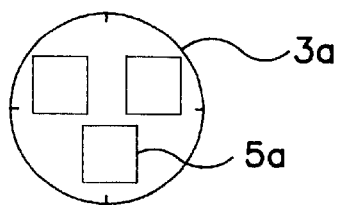
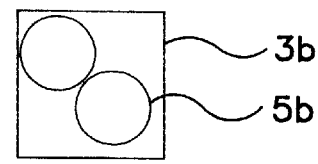
FIG. 5    FIG. 6
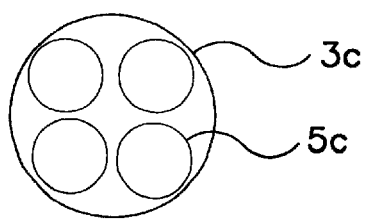
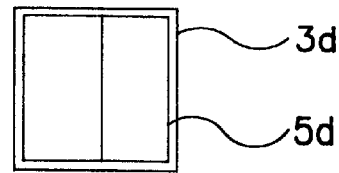
FIG. 7    FIG. 8
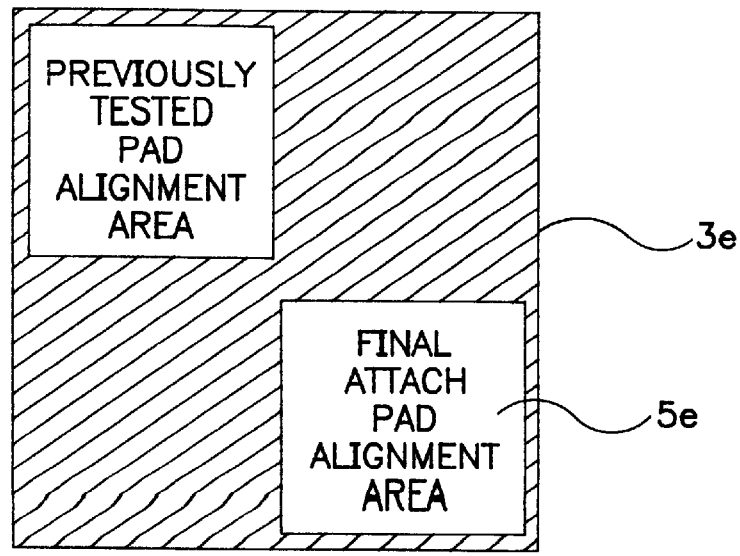
FIG. 9

REWORKABLE MICROELECTRONIC MULTI-CHIP MODULE

This is a division, of application Ser. No. 09/935,267, filed Sep. 22, 1997, now U.S. Pat. No. 5,920,464.

STATEMENT OF GOVERNMENT SUPPORT

This invention was developed during the course of Contract or Subcontract No. F04606-90-D-0001, D.O. 0063 for the Department of Defense. The government has certain rights in this invention.

FIELD OF THE INVENTION

This invention relates to rework of multi-chip modules and, more particularly, to a bonding structure that permits removal of an individual cold welded microelectronic chip from the module and its replacement therein with a substitute cold welded microelectronic chip.

BACKGROUND

Microelectronic chips are minute sized electronic circuits as may be formed of a number of different materials, including organic material, superconducting material and semiconductor material, to provide electronic functions, such as amplification, oscillation and the like. Although the materials and fabrication for those devices may differ, the result is a small or minute size device, referred to as a chip.

By way of example, those microelectronic chips, referred to as semiconductor chips or, more accurately, semiconductor dies, are formed within a large wafer of material that, following processing, is cut apart into a large number of individual semiconductor dies of rectangular shape. Each of those dies contains the particular electrical properties desired of a particular electronic component or device, and the die may form any of the familiar electronic devices specified by the semiconductor device designer, such as, by way of example, microprocessors, random access memory, digital processors, R.F. amplifiers, and the like, the specific device not being relevant to the present invention. Other examples are found in the small devices manufactured of superconducting material.

Although reference, such as the foregoing reference, may be made herein to semiconductor chips, the reader is cautioned that specific reference herein to same should not be construed to limit the scope of the present invention to chips formed of semiconductor material. As the detailed description that follows makes clear the present invention has application to all such electronic chips, irrespective of the physical principles underlying the functional electronic properties of the particular chip.

As fabricated, each microelectronic chip also contains a number of metal spots, suitably of gold or aluminum, termed connection sites or bonding pads, usually arranged or spaced apart in one or two rows along a relatively flat upper surface. By means of those bonding pads, the microelectronic chip may be electrically connected in electrical circuits with other electronic devices, either for receiving and/or sending electrical signals, and with a D.C. source that provides electrical power to operate the device.

Before the microelectronic chip is industrially useable, however, it is packaged in a protective container or, as variously termed, package. That package also contains the electrical contacts, terminals, or prongs, as variously termed, that extend through the package for connection to external electrical circuits customarily formed on a printed circuit board. Inside the package, the connection sites or bonding pads on the chip, are electrically connected to a corresponding one of those electrical terminals or prongs, allowing the chip, so to speak, to communicate with the outside world. Those internal electrical connections may be formed in a number of different known ways: cold welding, wire bonding or solder bonding.

In most cases, an individual microelectronic chip is assembled into its own container or package, such as the known plastic package or the Cermet package. An important clarification is given to avoid any confusion for the reader. As individually packaged, the microelectronic device is also customarily referred to generally as a microelectronic chip. To avoid confusion due to that dual use of the terminology, the reader should understand that when reference is made to microelectronic chip in the description of the present invention, unless otherwise noted, the reference is intended to an unpackaged chip.

Continuing with this background, a single packaged chip is typically inserted into a printed circuit board, along with other individual packaged chips and other electrical components, and is soldered in place. If for any reason, a chip on that circuit board fails, the circuit board is easily fixed or, as variously termed, reworked. The chip is unsoldered and removed, and another identical chip is soldered back in place on the circuit board. Since individually packaged chips are inexpensive and are not designed to be repaired, the failed chip is conveniently discarded.

Alternatively, for reasons not here relevant and not discussed, a quantity of two or more microelectronic chips and associated circuits are often assembled together in a single package, referred to as a multi-chip module (MCM). Typically an MCM package contains two, three, or more microelectronic chips and associated circuits, which are supported in common on a base. The base, typically a circuit board formed of ceramic or laminated substrate, supports and includes the electrical circuit paths for the microelectronic chips and ancillary components, and contains the signal and power leads that extend to the outer edges of the base; and also serves as a bottom wall to the module package. A continuous side wall, referred to as a seal ring, seals the base's upper surface and surrounds the region occupied by the microelectronic chips and ancillary components. The signal and power conductors, are routed through intermediate layers of the base's multiple layers and under that seal ring to the outside of the side wall and on all four sides of the seal ring. Electrical terminals, located outside the seal ring, connect to those signal and power conductors and extend outwardly, enabling the module to be connected to external circuitry. The module is closed by a metal cover or lid that typically is hermetically sealed to the seal ring. It is appreciated that the multi-chip module is a complex electronic device and its performance benefits are achieved at significant manufacturing cost.

Cold welding, more specifically, Indium cold welding is presently becoming the bonding technique of choice for bonding the microelectronic chips into a multi-chip module when exposure of sensitive circuit elements to elevated temperatures cannot be tolerated. It is a simple, low cost approach to accomplish bonding. In this technique, metal pads of equal size and composition, preferably Indium, are deposited at the connection sites on both the microelectronic chip and the multi-chip module's printed circuit board. The deposit is of a suitable thickness, as example, between twelve and three-hundred microns. Pure Indium is preferred as the deposited metal since it is very soft and deforms easily. The chip is turned over, that is, "flipped" over, a basis for the "flip chip" terminology, so that the connection sites on the chip face the corresponding connection sites or bonding pads on the substrate. The connection sites on the chip are aligned with associated connection sites on the other element, and the two elements are pressed together at about room temperature.

As a consequence Indium from both the flip chip's connection sites and the sites on the substrate diffuse into each other, creating a mechanical and electrical bonds, referred to as cold weld joints. The foregoing produces a cold welded microelectronic chip. Thus, when one skilled in the art makes reference to a cold welded microelectronic chip, and as that term is used in the following description, the reference is to the foregoing structure. The cold weld process is simple and low cost. However, it has one basic flaw in this application. In case of a microelectronic chip failure, the multi-chip module module cannot be reworked.

As one appreciates, the multi-chip module contains many chips and other electrical components. It is a much much more expensive component to produce than a single packaged microelectronic chip. Until the present invention, if for any reason one of the chips in the multi-chip module fails, the entire module must be removed and replaced with another, a very expensive proposition, unless it is possible to rework the multi-chip module, which, as hereafter explained, has not been the case with cold welded multi-chip modules. The inability to rework cold welded multi-chip modules, required construction of additional reserve replacement modules, spares, when a single multi-chip module is purchased, and adds to the great expense.

The inability to rework is due to the metal diffusion that formed the cold weld joint. When the cold weld joint is broken to remove the microelectronic die or as variously termed, chip, from the printed circuit board to fix or rework the module, the place in the cold weld material at which the weld tears is uncontrollable, that is, random in nature. For example, the Indium joint could break at the interface with the chip pad leaving no Indium on the microelectronic chip connection site, or break at the interface with the substrate pad, leaving no Indium on the substrate, or at some location in-between those two extremes. Because the amount of Indium remaining on the chip connection sites and the substrate pad sites in unpredictable and cannot be controlled, rework is impossible.

Consider for example a microelectronic die containing two rows of connection sites with twenty connection sites in each row that is Indium cold welded to corresponding sites on the substrate, the printed circuit board. When the suspect chip is torn away from the substrate, the connection sites on the substrate will contain residual Indium that extends vertically to different levels of height, and one or more sites may have no Indium at all. A fresh replacement chip contains connection sites having Indium deposited uniformly to a predetermined height or depth as variously termed. Thus were one to seek to cold weld that fresh replacement chip to the substrate, some of those sites on the chip would not sufficiently contact some of the shorter height connection sites on the substrate, and, in those situations in which the Indium was completely stripped off a connection site on the substrate, there would be no mechanical or electrical contact whatsoever. Should only one of the sites on the chip fail to make a physical and electrical connection to a corresponding site on the substrate, the electrical circuit fails and the multi-chip module is a complete loss.

Further, the connection sites on the suspect chip which was torn away also contain different heights of residual Indium and perhaps at least one site in which the Indium is torn away completely, the exact configuration being unpredictable due to the random nature of the tearing. Should one desire to return that same chip and try to cold weld it back in place, one would find that at the site at which the Indium was completely torn away, a successful cold welded joint cannot be reconstructed. And again the module fails and would have to be discarded. Thus it is not possible to remove a cold welded flip chip from the circuit board substrate to perform electrical tests on that flip chip and thereafter replace that flip chip on the circuit board.

Although the cold weld process is a simple, low cost approach to flip chip to substrate bonding, the inability to perform rework makes the cost of multi-chip module's prohibitive in many cases.

To provide a reworkable cold weld multi-chip module, one might initially make reference to one of the other microelectronic bonding techniques, only to find other seemingly insurmountable obstacles of a different nature. Wire bonding was initially used to electrically interconnect microelectronic dies to a substrate. Wires were extended between the connection sites on the upper surface of the microelectronic chips and the metal pads on the substrate that supports the chip. For rework, one need only cut the connecting wires and remove the failed chip, and rewire a replacement chip in place. That bonding technique, however, does not prove satisfactory in high speed digital or high frequency applications. Due to their great length, the wires exhibit too much electrical inductance, and that high inductance limits the speed at which the electrical signals may travel.

Solder bonding offered another alternative. In this bonding technique the chip was turned upside down, the origin for naming the construction as "flip-chip", and the chip's electrical connection sites, are soldered directly to aligned metal bonding pads deposited on he circuit board. This technique avoids lengthy wires as in the case of wire bonding. To accomplish soldering, minute solder balls are deposited on the metal bonding pad and the entire assembly, including the microelectronic chips, are heated to solder the flip chip's contacts to the bonding pad, producing a mechanical and electrical connection. That bonding technique proved satisfactory and it is used to fasten flip chips in place even in the multi-chip modules.

When a flip chip in the multi-chip module of this construction is found to be inoperative or fails in service, the multi-chip module could be reworked. That is, by reheating the multi-chip module assembly sufficiently to cause the solder to reflow, the suspect chip could be could be pulled away and removed. A replacement chip could then be substituted in its place and the solder again reflowed to mechanically and electrically join the new flip chip to the base.

However, a typical solder used in that application reflows at about 200 degrees Centigrade, a temperature which most microelectronic devices, including semiconductors, could easily tolerate. Unfortunately, not all semiconductors and other microelectronics used in high performance multi-chip modules are capable of withstanding those solder reflow temperatures. The solder bonding approach is not a viable alternative for temperature sensitive multi-chip modules. The solder bonding technique is thus limited to those circuits which are able to withstand elevated temperatures.

Thus, prior to the present invention, no technique existed for reworking the cold welded multi chip modules, either to replace a defective chip or remove a chip for test and later return it to the module, if the flip chip was connected by an Indium cold weld joint, that is, was Indium cold welded to the module's base.

The lack of a viable alternative bonding technique and the inability to perform rework of cold welded microelectronics makes the cost of high performance multi-chip module's prohibitive in many cases, the dilemma that faced the applicants and led to the present invention. The present invention solves the problem of rework of high performance cold welded multi-chip modules. The present invention no longer requires one to discard a cold welded multi-chip module merely because a chip in that module has failed, thereby providing a significant economic advantage in this field.

The present invention offers a novel approach to performing rework on cold weld flip chip assemblies. The invention permits an individual non-functioning flip chip in a multi chip module to be removed and replaced with a working flip chip. By making rework possible, multi-chip modules containing one failed chip may now be salvaged.

Accordingly, the principal object of the invention is to make possible the rework of cold welded multi-chip modules and thereby salvage such modules.

Another object of the invention is to permit construction of high performance cold welded multi-chip modules at lower cost and with greater efficiency than heretofore.

A further object is to define a new technique for rework of cold welded multi-chip modules.

An ancillary object of the invention is to provide a cold weld joint that severs or breaks in a predictable manner when the joint is manually broken.

SUMMARY OF THE INVENTION

In accordance with the foregoing objects and advantages, the reworkable multi-chip module contains cold welded microelectronic chips in which the microelectronic chip's cold weld metal bonding pads are constructed of a metal having one hardness and the corresponding cold weld metal bonding pads of the multi-chip module's substrate are of a different hardness. Despite the difference in hardness, the two metals cold weld to one another. The contact area of the bonding pad constructed of the softer metal formed on one such element is larger than the contact area of the mating bonding pad on the other element. Suitably the metal is the same for each, preferably Indium, which is available in different forms having different hardnesses, such as evaporative Indium and plated Indium.

If for any reason such a cold welded microelectronic chip must be removed from the module, it is found that the cold weld breaks at a predictable location. The softer metal on the chip bonding pads is imprinted, while the harder metal generally retains its shape, permitting the latter to again be cold welded. A new microelectronic chip may thereby be cold welded to the substrate as a replacement. The multi-chip module is thus reworkable. Those skilled in the art recognize the foregoing defines a new rework process for cold welded microelectronic chips.

in an additional embodiment one of the metal pads associated with the chip.

In an additional embodiment on of the metal pads associated with the chip provides a large enough surface area that can accommodate positioning the substrate's mating bonding pad in any of two or more mutually exclusive areas. When microelectronic chip is cold bonded to a substrate, such as a testing substrate, it is selectively aligned so that the substrate's bonding pads fit in a selected one of those mutually exclusive areas, leaving the other area untouched. When the microelectronic chip is removed from that substrate, it can be cold welded to multi-chip module substrate, by carefully aligning the chip's bonding pads so that the pads of the multi-chip module substrate fall within the other virgin region of the chip's bonding pads.

The foregoing and additional objects and advantages of the invention together with the structure characteristic and additional features thereof, which was only briefly summarized in the foregoing passages, becomes more apparent to those skilled in the art upon reading the detailed description of a preferred embodiment, which follows in this specification, taken together with the illustration thereof presented in the accompanying drawings.

DESCRIPTION OF THE DRAWINGS

In the drawings:

FIGS. 5, 6, 7, and 8 illustrate different shapes and sizes for the bonding pads as may be used in additional embodiments of the invention; and FIG. 9 illustrates to a larger scale the relative shapes and size of the preferred form of the two types of bonding pads used in a preferred embodiment of the invention.

DETAILED DESCRIPTION OF THE PREFERRED EMBODIMENTS

Figure 1:
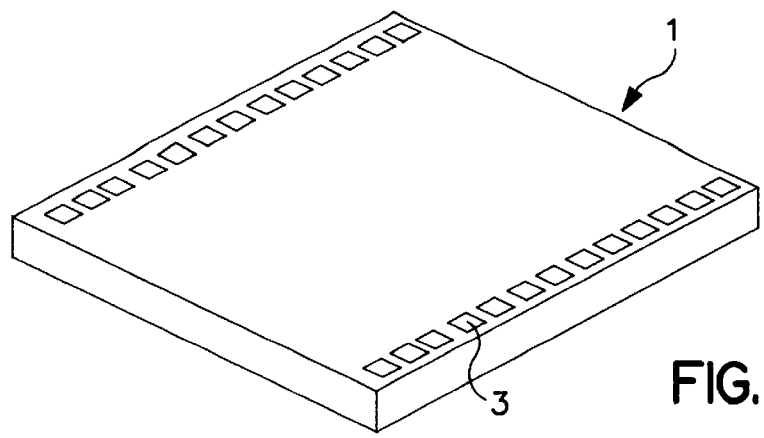
FIG. 1 is a perspective view of a microelectronic chip containing cold weld metal bonding pads on its surface which incorporates the invention.

Reference is first made to FIG. 1, illustrating, by way of example, a microelectronic die 1 in isometric view. The die embodies an electronic device, the details of which are not material to the invention and need not be illustrated or described. It also contains two rows of spaced metal cold weld bonding pads 3 for electrical connections. The cold weld bonding pads are formed on the gold connection sites or bonding pads initially formed on the chip during processing of the microelectronic wafer on which the cold weld metal, preferably Indium, is deposited to the requisite thickness. The Indium covers the thin gold spot and provides the contact area or surface for cold welding. The cold weld bonding pads on the substrate are similarly formed by depositing cold weld metal on a thin gold layer marking the substrate connection site.

The form of Indium deposited on the chip contact sites is softer than the form of Indium deposited on the Multi-chip module substrate bonding pads. In one practical example, the hardness of the Indium on the microelectronic chip is less than 1.2 MOHS, using the MOHS hardness scale, and that on the multi-chip module substrate is greater than 1.2 MOHS.

For cold welding the microelectronic to the Multi-chip module substrate, chip 1 is turned over, inverted, so that its cold weld bonding pads face the corresponding connection sites on the Multi-chip module substrate, not illustrated in the figure, and are aligned with those sites. The microelectronic is pressed against the Multi-chip module substrate under room temperature conditions, up to about 70 degrees Centigrade, and held under that pressure for a few seconds. As those skilled in the art recognize, the foregoing cold welding process is the same as used in Indium cold welding of microelectronics upon substrates. Cold welding occurs and forms the cold weld joint between the two bonding pads. Specifically, the harder metal of the substrate cold weld bonding pads embeds in and diffuses with the softer metal on the microelectronic cold weld bonding pads.

Figure 2:
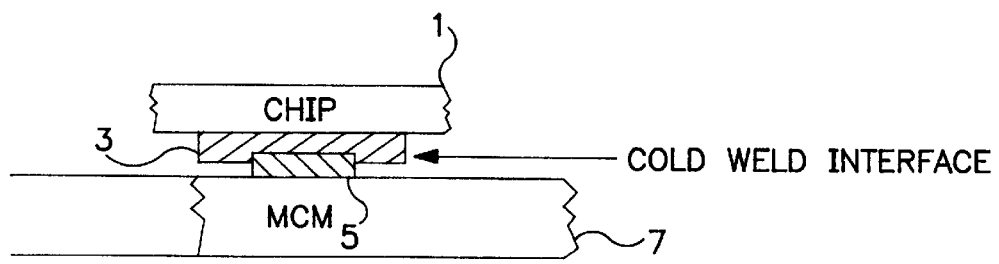
FIG. 2 is a partial section view of a side section of the chip of FIG. 1 as assembled to a substrate of a multi-chip module drawn to a larger scale.
Figure 3:
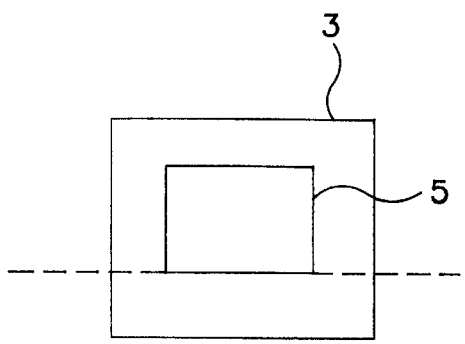
FIG. 3 is a partial bottom view of the cold weld metal bonding pads appearing in FIG. 2.

FIG. 2 offers a partial section view to an enlarged scale of one of the regions on the side of chip 1 as cold welded to a corresponding connection site on the Multi-chip module substrate 7 and illustrates the cold weld joint from the side; and FIG. 3 offers a partial top view of the cold weld bonding sites depicted in the side view of FIG. 2. The chip bonding pad 3 is cold welded to the substrate bonding pad 5 and at the interface between the two pads forms the cold weld joint.

As illustrated in FIG. 2, the width of bonding pad 3 is larger than the width of bonding pad 5. The same relationship is true for the relative lengths of the two pads, and the surface area of pad 3 is larger. As better illustrated in FIG. 3 the rectangular surface area of the chips cold weld bonding pad 3 is larger than the rectangular surface area of the substrate's cold weld bonding pad 5. Pad 3 is sufficient in size to accommodate the contact area of pad 5 wholly within its boundaries. As described in connection with another embodiment the surface area of bonding pad 3 should preferably be large enough to permit the surface area of bonding pad 5 to occupy any one of four separate non-overlapping portions of the surface area of pad 3, or as otherwise stated the surface of bonding pad 3 should be able to receive four pads the size and geometry of bonding pad 5 in mutually exclusive portions of its contact surface.

Figure 4:
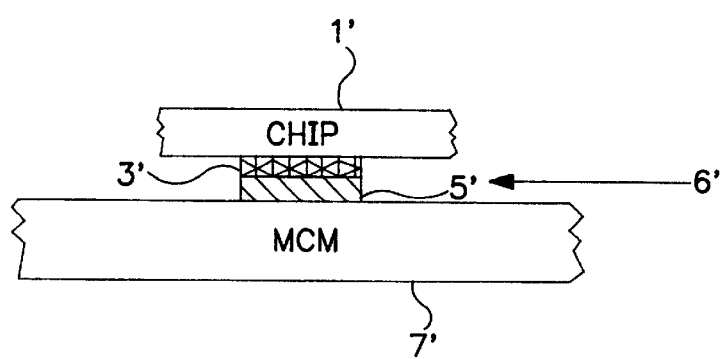
FIG. 4 illustrates a partial section view of a prior art microelectronic referenced in the discussion of the invention.

To assist one to better visualize the difference between the foregoing and the prior art structures, a corresponding side partial section view of a prior art cold weld joint, corresponding to FIG. 2, is illustrated in FIG. 4, which may be briefly reviewed. For convenience, elements that have the same function are denominated by the same number designation and primed. In this prior art structure the bonding pads 3' and 5' are of the same material and of the same size.

Consider a cold welded microelectronic chip that is constructed in accordance with the invention. When the microelectronic chip is removed from the multi-chip module, that is, from the module's base of substrate, by tearing the chip away and breaking the cold weld joint, it is discovered that the integrity of the harder metal is not disturbed, leaving an imprint in the softer metal of the chip bonding pad. This allows the point at which the cold weld joint is broken during rework to be easily controlled, avoiding the randomness incident to the prior cold welding structure. Effectively, the integrity of the substrate pad material is maintained, while the material of the chip bonding pad is sacrificed. Thus, if rework of a multi-chip module is needed due to failure of a chip, the chip may be removed from the module, and a new replacement chip can be dropped and cold welded to the module.

In the context of this application a hard metal is regarded as any metal with a hardness of 3.0 or larger on the MOHS hardness scale. A soft metal is one whose hardness is less than 3.0 MOHS. Typically a soft metal is pliable, soft, or ductile. All such soft metals can cold weld. This invention uses electrically conductive soft metals of different hardness characteristic or, simply, different hardness. It is believed that, generally speaking, metals having hardness in the range of about one to three on the MOHS hardness scale are suitable for cold weld rework as described in this invention. Thus, the harder of the two metals is selected from the range of 1 to 3 MOHS hardness, which includes the ends of the specified range. The softer of the two metals for the cold weld joint is then selected to be of a lesser hardness. As example, if the harder of the two soft metals is 1 MOH in hardness, the other softer metal is selected to be less than 1 MOH in hardness. Due to limitations of suitable hardness measurement apparatus, it is not possible at present to provide precise examples of how small or how great such difference is found to be.

The difference in hardness may be obtained by using different metals or may be obtained in other ways. The metal on each of the Multi-chip module pads and chip pads may be the same metal but in different forms, which have different hardness. These different forms of a given metal are well known to those skilled in the metal plating arts. As example gold can be obtained in a spongy form, which is softer than the known form of solid gold. Impurities may also be added to a melt of gold, and when solidified, the gold is harder. As example, nickel is added to the gold in wedding rings to make the ring more durable, and the gold alloy is more hard than pure gold.

Indium is used for both metal bonding pads in the preferred embodiments. In its pure form, Indium has a hardness of 1.2 MOHS. Indium can be obtained in different degrees of hardness. Indium can be obtained by evaporation, a form that is referred to as evaporative indium. It is soft, less than 1.2 MOHS in hardness. Other Indium can also be obtained by plating, referred to as plated indium. This form is hard, greater than 1.2 MOHS in hardness. The preferred embodiment of the invention uses one metal for the chip cold weld metal bonding pad and the same metal of different hardness for the substrate cold weld metal bonding pad. Thus cold weld pad 3 in FIG. 2 is formed of a deposit of evaporative indium, while cold weld pad 5 is formed of a deposit of plated indium.

The metals chosen for each of the bonding pads is given on the basis of their relative hardness. However, one also desires to avoid the creation of large contact potentials as might develop between dissimilar electrically conductive metals, which might have adverse effect in the Multi-chip module, and is presently unknown.

Additionally, the metals should have the same or essentially the same thermal expansion characteristic so as to avoid placing undue stress on the weld or substrate as might break the bond when the module experiences a change in temperature. In that respect the metals should be compatible. For that reason, the use of different forms of the same metal are preferably selected for the Multi-chip module pads and the chip pads. Such different forms are known to have different hardness. Of those Indium is the metal presently preferred.

The foregoing selection should not be taken to mean that different metals will not function or will cause adverse effect upon the chips operation in circuit on the module. To the contrary, the applicant's believe they will perform, but they have not verified that fact. The statement simply is intended as a caution for the reader, and as an area for additional study, since the preferred form given is believed to be free of those unknowns.

As illustrated in FIG. 2, pad 5 is large enough in cross section to cover a good portion of the surface area of pad 3 within which it is received. It is still not possible, however, in that embodiment, to replace the same microelectronic chip back onto the multi-chip module substrate by reusing pad 3, should the microelectronic chip be removed for testing and pass those tests. Removal of the chip results in scarring, that is, imprinting the portion of the soft metal surface which was in contact with the more hard substrate bonding pad 5. Were the chip returned and placed in the same location, the imprinted material would result in an unsatisfactory cold weld joint, if any cold welding occurs at all. That fundamental problem is easily solved by making the relative size and/or profile geometry of the associated pads such that the substrate pad 5 may be selectively placed in contact with different mutually exclusive areas on the surface of pad 3.

Such alternative structures are illustrated in FIGS. 5, 6, 7, 8 and 9. As shown in FIG. 5, a circular contact surface area of pad 3a is large enough in size to receive a square shaped pad 5a at any of three mutually exclusive locations. As shown in FIG. 6 a square shaped pad 3b is large enough to receive a circular shaped pad 5b at any of two locations. As shown in FIG. 7 a circular shaped pad 3c is large enough in area to receive a circular shaped pad 5c at any of four locations. And as shown in FIG. 8 a square shaped pad 3d is large enough in area to received a rectangular shaped pad 5d at either of two locations. In FIG. 9 a square shaped pad 3e is large enough in area to receive a square shaped pad 5e at any of four mutually exclusive locations on the pad's surface.

With any of the foregoing pad shapes, a microelectronic chip may be removed from the substrate to which it was cold welded, and, it may be cold welded back in place on the substrate, if one desires to do so.

Considering the preferred structure of FIG. 9, it is seen that even though the removal of the chip breaks the cold weld joint and imprints the portion of the surface of pad 3e overlying or confronting pad 5e, other portions of pad 3e remain virgin and untouched and are large enough to receive pad 5e. Thus when the chip is to be reinserted into position on the board, it is aligned relative to the substrate bonding pads so that the substrate bonding pad confronts a virgin region on the surface of pad 5e. Cold welding can then be satisfactorily accomplished.

It is appreciated that the present invention is not limited to the particular details described in connection with a preferred embodiment. As example, the foregoing embodiment uses the softer cold weld metal on the chip bonding pad and the harder cold weld metal on the substrate bonding pad. As those skilled in the art recognize, and in accordance with the invention, the foregoing relationship may be reversed; the harder metal could be used on the chip bonding pad and the softer cold weld metal could be used on the substrate's bonding pad.

The invention solves another critical aspect of flip chip cold weld bonding; and that is the need for placement of a known good microelectronic die. To maximize the functionality of a multi-chip module assembly, the performance of the individual chips within that module must first be verified. Once the chip passes that preliminary "burn-in" testing, the chip's functionality on the multi-chip module is guaranteed. The problem faced by the industry is how to pre-test the chip without sacrificing the pad integrity required for attachment to the multi-chip module. The present invention provides the solution to that problem.

The placement of the known good die relies upon the fact that the flip chip pad, connection site, is larger than that of the corresponding multi-chip module pad. A test substrate is used that contains cold weld Indium connection sites or pads identical to those contained on the Multi-chip module. The pre-test is performed by cold welding the microelectronic chip to the test substrate by aligning one corner of the chip's pads to the smaller Multi-chip module bonding pads on the test substrate and cold welding the two together to form the Indium cold weld joints. The chip is then electrical tested and verified. Thereafter, when testing proves successful, the chip is removed from the test substrate, breaking the cold weld joints. That removal leaves an imprint in a portion of area or sector of the chip's bonding pad.

Placement of the chip is then made onto the multi-chip module. The chip is now aligned with the multi-chip module pads, aligning the opposite corner of the chip pads to the multi-chip module pads. As so aligned, the two dimensional area on the chip pad that confronts the mating surface of the smaller sized multi-chip module pad is a virgin surface, permitting successful reattachment of the chip. The two elements are then cold welded together.

It is appreciated that the invention offers a simple and effective means to solve an important problem and offers the industry the means to achieve untold direct economic benefit in the construction of multi-chip modules and make multi-chip modules available at reasonable prices. With pricing thereby becoming more reasonable, the invention also provides an indirect benefit by expanding their use in new applications, where previously it was uneconomical to do so. Multi-chip module designers may now proceed to design larger and more complex circuits in the modules with full confidence that the module may be salvaged, should any of the many included microelectronic chips fail.

It is appreciated that the invention has application to all forms of microelectronic chips, a generic term that encompasses chips formed of semiconductor material, chips formed of superconducting material, chips formed of organic material, and the like in which a chip of minute size contains electrical contacts that are to be bonded to a substrate or base, and as used in the claims which follow the term microelectronic is construed to possess such a generic meaning.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A method for installing a cold welded microelectronic chip within a multi-chip module comprising the steps of:

cold welding said microelectronic chip to a test substrate to provide a cold welded microelectronic chip test assembly;

testing said microelectronic chip to verify its functional characteristics;

removing said cold welded microelectronic chip from said test substrate; and cold welding said microelectronic chip to said multi-chip module.

2. The method as defined in claim 1, wherein said chip includes chip cold weld bonding pads, said test substrate includes cold weld bonding pads for cold welding to corresponding ones of said chip cold weld bonding pads, and said multi-chip module includes a substrate containing cold weld bonding pads for cold welding to corresponding ones of said chip cold weld bonding pads; and wherein each said chip weld bonding pad has a surface region sufficiently large in size relative to the size and geometry of said Multi-chip module and test substrate bonding pads to permit a multi-chip module bonding pad and test substrate bonding pad to fit within two separate mutually exclusive portions thereof; and wherein said step of cold welding said microelectronic chip to a test substrate includes the steps of:

aligning the chip cold weld bonding pads with the corresponding test substrate bonding pads so that the test substrate bonding pads confront one of said two separate portions of said chip cold weld bonding pads; and pressing the microelectronic chip against said test substrate bonding pads to produce a cold weld joint covering said one of said two separate portions of said chip cold weld bonding pads.

3. The method as defined in claim 2, wherein said step of cold welding said microelectronic chip to said multi-chip module includes the steps of:

aligning said chip cold weld bonding pads with the corresponding multi-chip module substrate bonding pads so that the multi-chip module substrate bonding pads confront a different one of said two separate surface portions of said chip cold weld bonding pads; and pressing said microelectronic chip against said multi-chip module bonding pads to produce cold weld joints covering said different one of said two separate surface regions of said chip cold weld bonding pads.

* * * * *